United States Patent
Yanagisawa

(10) Patent No.: US 8,323,878 B2
(45) Date of Patent: Dec. 4, 2012

(54) METHOD OF MANUFACTURING OPTICAL WAVEGUIDE LAMINATED WIRING BOARD

(75) Inventor: Kenji Yanagisawa, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 226 days.

(21) Appl. No.: 12/814,783

(22) Filed: Jun. 14, 2010

(65) Prior Publication Data

US 2010/0323297 A1 Dec. 23, 2010

(30) Foreign Application Priority Data

Jun. 19, 2009 (JP) ................................ 2009-146398

(51) Int. Cl.
*G02B 6/10* (2006.01)

(52) U.S. Cl. ....... 430/315; 430/319; 430/321; 427/97.1; 427/555; 205/125

(58) Field of Classification Search .......................... None
See application file for complete search history.

(56) References Cited

U.S. PATENT DOCUMENTS

| | | | | |
|---|---|---|---|---|
| 2003/0053765 A1* | 3/2003 | Oda et al. | ......................... | 385/88 |
| 2005/0089264 A1* | 4/2005 | Johnson et al. | .................. | 385/15 |
| 2008/0317402 A1* | 12/2008 | Kodama et al. | .................. | 385/14 |

FOREIGN PATENT DOCUMENTS

JP 2002-250830 A1 9/2002

* cited by examiner

*Primary Examiner* — John A. McPherson
(74) *Attorney, Agent, or Firm* — Kratz, Quintos & Hanson, LLP

(57) ABSTRACT

A via hole is formed in a first cladding layer laminated on a wiring board. A conductive material is filled in the via hole so as to form a first conductor portion (a portion of a conductive via) having a mushroom-like shape projecting from a surface of the first cladding layer. Then, a second cladding layer is formed to cover the first conductor portion, the first cladding layer and a core layer, and a via hole is formed in the second cladding layer. A conductive material is filled in the via hole so as to form a second conductor portion (a remaining portion of the conductive via) connected to the first conductor portion.

9 Claims, 9 Drawing Sheets

METHOD OF MANUFACTURING OPTICAL WAVEGUIDE LAMINATED WIRING BOARD

CROSS-REFERENCE TO RELATED APPLICATIONS

This application is based on and claims priority of Japanese Patent Application No. 2009-146398 filed on Jun. 19, 2009, the entire contents of which are incorporated herein by reference.

BACKGROUND OF THE INVENTION (a) Field of the Invention

The present invention relates to a technology for forming an optical waveguide integral with an electric wiring board. More specifically, it relates to a method of manufacturing an optical waveguide laminated wiring board including a wiring board and an optical waveguide laminated thereon, the optical waveguide laminated wiring board being used for surface mounting an optical component such as a light emitting element and a light receiving element.

Since such an optical waveguide laminated wiring board plays a role in mounting of an electronic component such as a semiconductor element besides an optical component, the optical waveguide laminated wiring board is also referred to as a "package" for convenience in the description below.

(b) Description of the Related Art

There are various structures as a form of a wiring board integral with an optical waveguide. In one of such structures, an optical waveguide (a structure including a core layer for transmitting an optical signal, and cladding layers laminated on and below the core layer in a sandwiching manner) is laminated on a surface layer or an inner layer of a board used as a package or the like. An electronic component such as a semiconductor element (IC chip) in addition to an optical component such as a laser element is mounted on the surface of the wiring board having the above-described structure. Accordingly, a conductive via penetrating an optical waveguide in a thickness direction thereof has to be formed as means for electrically connecting an electrode terminal of each component to a pad for connection (a portion defined at a desired position in a wiring layer on the surface layer or in the inner layer) provided in the wiring board.

For example, for a structure where an optical waveguide is laminated on a surface layer of a wiring board, a method typically adopted to form a conductive via in the optical waveguide is as follows. Specifically, a via hole is formed at a desired position in the optical waveguide by a laser or the like, the via hole reaching a pad of the board. Then, the via hole is filled with a conductive material by electroless plating, or the like.

An example of a technique related to the above-mentioned prior art is described in Japanese unexamined Patent Publication (Kokai) 2002-250830. This document discloses an IC chip mounting board including: a conductor circuit and an interlayer resin insulating layer laminated on each of surfaces of a substrate; a solder resist layer formed on the outermost layer; and an optical element mounted on the IC chip mounting board. Moreover, an optical waveguide is formed within the board, and an optical signal transmitting optical path is formed to connect the optical element to the optical waveguide.

In a conventional wiring board integral with an optical waveguide as described above, as means for connecting an electrode terminal of an optical component or the like mounted on the surface of the wiring board to a pad of the wiring board, a conductive via is provided in the optical waveguide. As a method of forming the conductive via, a via hole opened in the optical waveguide is filled with a conductive material (Cu or the like) by copper (Cu) electroless plating, or the like. Specifically, after the optical waveguide (including a core layer and cladding layers laminated on and below the core layer in a sandwiching manner) is completed, the forming and then filling of the via hole are performed.

For this reason, a restriction is imposed by the aspect ratio (ratio of the diameter of the via to the thickness of the board) and the depth of the via, such that such conductive vias cannot be arranged at smaller intervals (at fine pitches). Incidentally, when a vertical-cavity surface-emitting laser (VCSEL) is mounted as the optical component, the pitch of the vias is desirably approximately 125 µm or approximately 62.5 µm. It is difficult to meet such a demand with the aforementioned conventional method of forming a conductive via. Namely, the conventional technique has a difficulty in arranging conductive vias at fine pitches.

Moreover, the restriction by the aspect ratio and the via depth brings about the following problem. When the aspect ratio is 1 or lower (for example, the via diameter is 50 µm while the thickness of the optical waveguide is 55 µm), it is highly likely that a conductive material is insufficiently filled into the via hole thus opened (for example, filling by Cu plating). In this case, since the conductive material is not filled sufficiently, an electrical conduction failure is caused between an electrode terminal of a component to be mounted and a pad of a board, which are connected to each other through the conductive via (the connection reliability is impaired). Consequently, the yield rate is reduced.

SUMMARY OF THE INVENTION

An object of the present invention is to provide a method of manufacturing an optical waveguide laminated wiring board, which is capable of forming conductive vias at fine pitches in an optical waveguide integral with the wiring board, and preventing reduction in the yield rate caused by insufficient filling with a conductive material.

According to the invention, there is provided a method of manufacturing an optical waveguide laminated wiring board, the method including: preparing a wiring board including a pad for connection; forming a first cladding layer on a surface of the wiring board on a side where the pad is formed, and then forming a first via hole in the first cladding layer, the first via hole reaching the pad; filling a conductive material in the first via hole so as to form a first conductor portion having a top portion projecting from a surface of the first cladding layer; forming a core layer on a region neighboring a portion where the first conductor portion is formed on the first cladding layer; forming a second cladding layer on the first cladding layer and the core layer so as to cover the first conductor portion with the second cladding layer, and then forming a second via hole in the second cladding layer, the second via hole reaching the first conductor portion; and filling a conductive material in the second via hole so as to form a second conductor portion.

In the method of manufacturing an optical waveguide laminated wiring board according to the present invention, a via opening is formed in the first cladding layer formed on the wiring board (formation of the first via hole). A conductive material is filled in the via hole to form the first conductor portion having the top portion projecting in a "mushroom"-like form. Then, the second cladding layer is formed to cover the first conductor portion, the core layer, and the first cladding layer, and a via opening is formed in the second cladding layer (formation of the second via hole). A conductive material is filled in the via hole to form the second conductor portion connected to the first conductor portion. Namely, the formation of a conductive via is divided in two stages of the first conductor portion and the second conductor portion.

In a conventional method as described above, after an optical waveguide (including a core layer and cladding layers laminated on and below the core layer in a sandwiching manner) is completed, the opening and then filling of a via are performed. Accordingly, a restriction is imposed by the aspect ratio and the via depth, which makes the fine pitch arrangement of conductive vias difficult.

In contrast, in the method of the present invention, while the optical waveguide is formed by laminating the first cladding layer, the core layer, and the second cladding layer, the opening and the filling of the vias are performed. Accordingly no restriction is imposed by the aspect ratio and the via depth, and thus the fine pitch arrangement of conductive vias is feasible.

Moreover, since the formation of the conductive via is divided in two stages, the aspect ratio of each of the vias (the first conductor portion, the second conductor portion) formed in the respective stages can be selected to be higher than 1. This enables eliminating such a problem of an electrical conduction failure as encountered in the prior art due to insufficient filling of a via opening with a conductive material. Consequently the reduction in yield rate is prevented.

BRIEF DESCRIPTION OF THE DRAWINGS

FIG. 1A is a plan view thereof, and FIG. 1B is a longitudinal sectional view thereof seen along the line A-A' in FIG. 1A;

FIG. 2A is a plan view thereof, and FIG. 2B is a longitudinal sectional view thereof seen along the line A-A' in FIG. 2A;

DESCRIPTION OF THE PREFERRED EMBODIMENTS

Description is given below with regard to a preferred embodiment of the present invention with reference to the accompanying drawings.

Figure 1A:
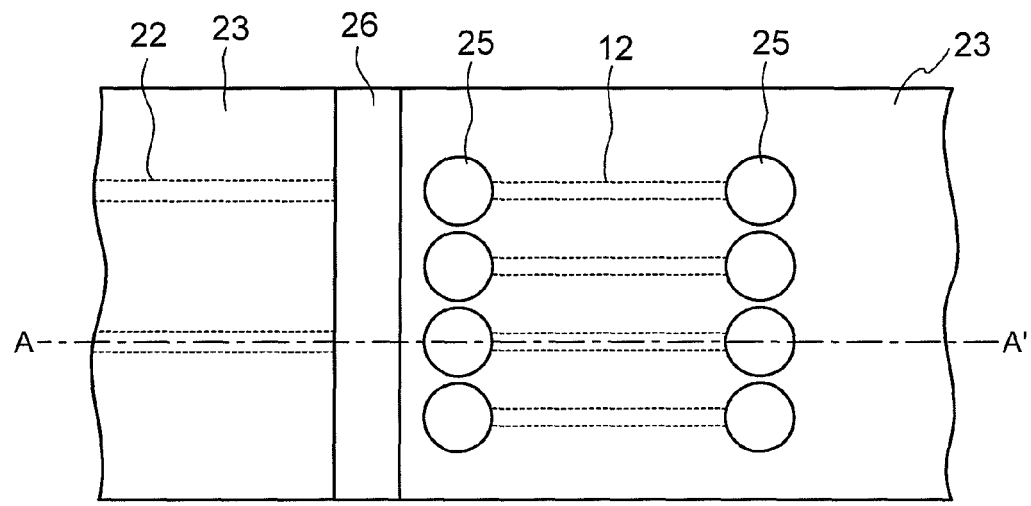
FIGS. 1A and 1B show the configuration of an optical waveguide laminated wiring board (package) according to an embodiment of the present invention.
Figure 1B:
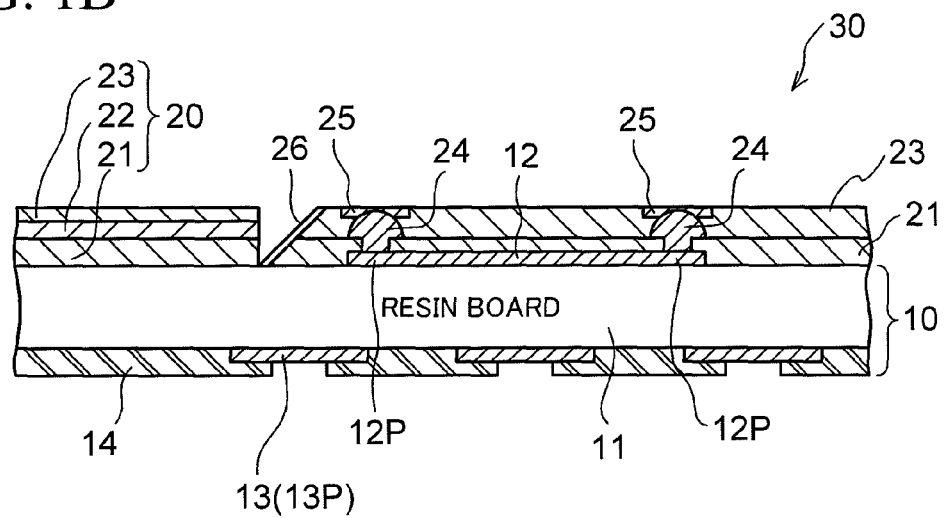

FIGS. 1A and 1B show the configuration of an optical waveguide laminated wiring board (package) according to an embodiment of the present invention. FIG. 1A shows a plan view of the package 30 seen from the top. FIG. 1B shows a longitudinal sectional structure thereof seen along the line A-A' in FIG. 1A.

The package (optical waveguide laminated wiring board) 30 according to this embodiment is used for surface mounting an optical component such as a light emitting element and a light receiving element as well as an electronic component such as a semiconductor element (IC chip) on one surface (the upper side in the illustrated example) thereof. Basically, the package 30 of this embodiment includes: a board (wiring board) 10 provided with an electric wiring; and an optical waveguide 20 which is integral with the wiring board 10, and which is laminated thereon (i.e., on the component mounting surface side of the wiring board 10), as shown in FIGS. 1A and 1B.

In the wiring board 10, reference numeral 11 denotes a resin board constituting a wiring board body; and reference numerals 12 and 13 denote wiring layers formed in desired shapes by patterning on the respective surfaces of the resin board 11.

Any board may constitute the resin board 11, as long as the board includes the wiring layers 12 and 13 formed at least on the outermost layers thereof, the wiring layers 12 and 13 being electrically connected to each other through the insides of the board. The wiring layer may or may not be formed within the resin board 11. When the wiring layer is formed within the resin board 11 (this is not a member characterizing the present invention, and thus detailed illustration is omitted), the outermost wiring layers 12 and 13 are connected to each other through wiring layers laminated with an insulating layer interposed therebetween within the board, and through via holes (and conductors filled therein; i.e., conductive vias) through which the wiring layers are interconnected. As an example of a board of this type, there is a wiring board of a multilayer structure formed by a build-up process. Meanwhile, when no wiring layer is formed within the resin board 11, the outermost wiring layers 12 and 13 are connected to each other through through-holes (and conductors filled therein) formed at desired positions of the resin board 11, the through-holes penetrating the resin board 11 in a thickness direction thereof.

Moreover, a solder resist layer (insulating layer) 14 is formed as a protection film on the surface of the wiring board 10 opposite to the component mounting surface side. The solder resist layer 14 covers the wiring layer 13 but exposes portions corresponding to pads 13P defined at desired positions of the wiring layer 13.

Meanwhile, the optical waveguide 20 integral with the wiring board 10 has a structure including a first cladding layer 21, core layers 22, and a second cladding layer 23 laminated in this sequence on the component mounting surface side (i.e., on the side where the wiring layer 12 is formed) of the wiring board 10 as shown in FIGS. 1A and 1B. The core layer 22 and the first and second cladding layers 21 and 23 are basically formed of the same material, for example, an acrylic resin such as poly(methyl methacrylate) (PMMA), an epoxy resin, a polyimide resin, a silicone resin, or the like. However, in order for an optical signal to be transmitted only within the core layer 22, the material for the cladding layers 21 and 23 formed on the respective surfaces of the core layer 22 is selected to have a lower refractive index than the material for the core layer 22.

Moreover, in the optical waveguide 20, a conductive via (having a structure in which two conductor portions 24 and 25 are connected in a columnar shape) characterizing the present invention is provided at a position (where no core layer 22 is formed) corresponding to the position of each pad 12P defined at a portion of the wiring layer (pattern) 12 on the wiring board 10. The lower conductor portion 24 constituting the conductive via is formed by filling a conductive material in a via (a via hole VH1 in FIG. 4B described later) formed by opening the first cladding layer 21. By the filling, a top portion of the conductor portion 24 is projected from the surface of the first cladding layer 21, and is formed to have a shape spreading in a "mushroom"-like form or semispherically as illustrated.

Figure 8A:
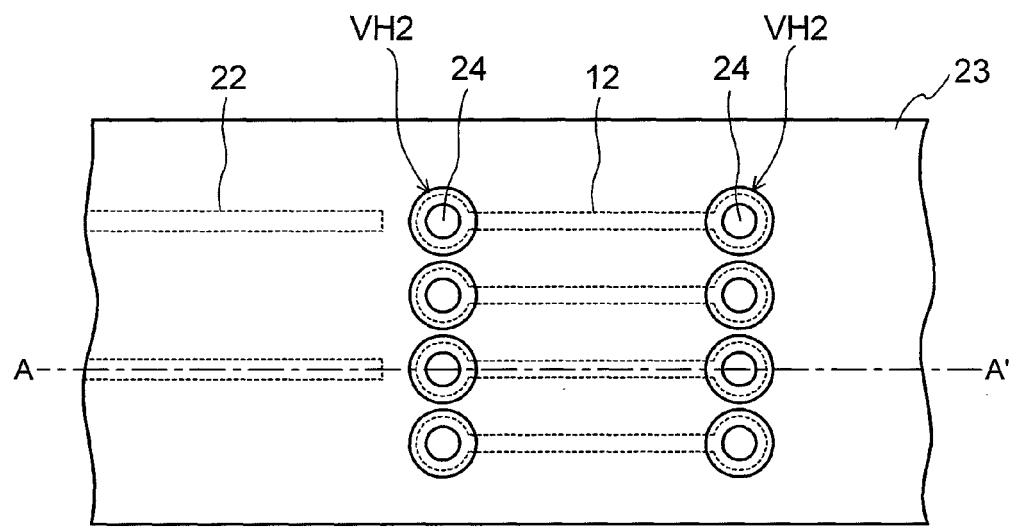
FIGS. 8A and 8B are views showing a manufacturing step following the step shown in FIGS. 7A and 7B.
Figure 8B:
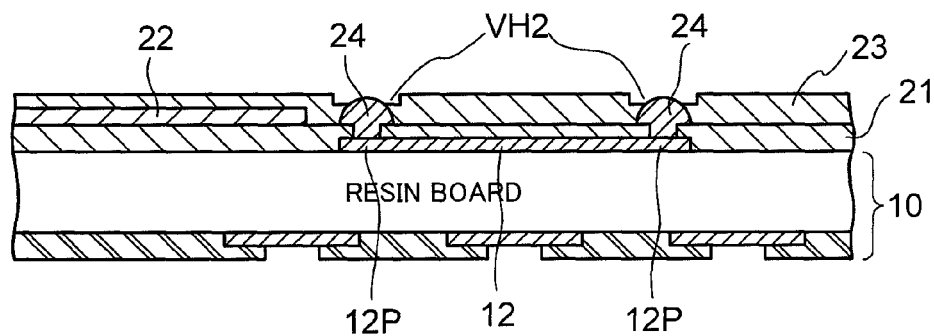

Meanwhile, the upper conductor portion 25 constituting the conductive via is formed by filling a conductive material in a via (a via hole VH2 in FIG. 8B described later) formed by opening the second cladding layer 23. By the filling, the conductor portion 25 is connected to the lower conductor portion 24 having a "mushroom" shape. The conductor portion 25 is exposed on the same plane as the surface of the second cladding layer 23 as illustrated. The drawing shows that the surface of the conductor portion 25 lies in a same plane as the surface of the second cladding layer 23.

Moreover, a reflection mirror 26 for optical path conversion is formed in a region where the core layer 22 of the optical waveguide 20 is formed. The reflection mirror 26 has a reflection surface at an end portion of the optical waveguide 20, the reflection surface being inclined at 45° to a travelling direction of light transmitting within the core layer 22. An opening is formed above the reflection mirror 26 (i.e., a V-shaped groove is formed in the sectional view). The position of the V-shaped groove is selected at a position which faces a light emitting surface or light entering surface of an optical component mounted on this package 30.

Incidentally, in this embodiment, the description has been given by taking an example where the reflection mirror 26 is formed at a desired position in the optical waveguide 20 as illustrated. The reflection mirror 26 does not always have to be formed prior to the delivery. Namely, the package may be delivered without forming the reflection mirror 26 (i.e., in a state shown in FIGS. 9A and 9B described later), and the V-shaped groove is formed as needed at a delivery destination or other sites to then form the reflection film on the inclined surface of the groove.

Alternatively, in consideration of convenience for a customer and so forth, solder may be deposited, for example, by pre-soldering in advance on the exposed surface of the upper conductor portion 25 of the conductive via provided in the optical waveguide 20. This is to facilitate the connection through a solder bump, gold (Au) bump, or the like between the exposed surface and an electrode pad (terminal) of an optical component and the like mounted on the package 30 as described later.

Figure 2A:
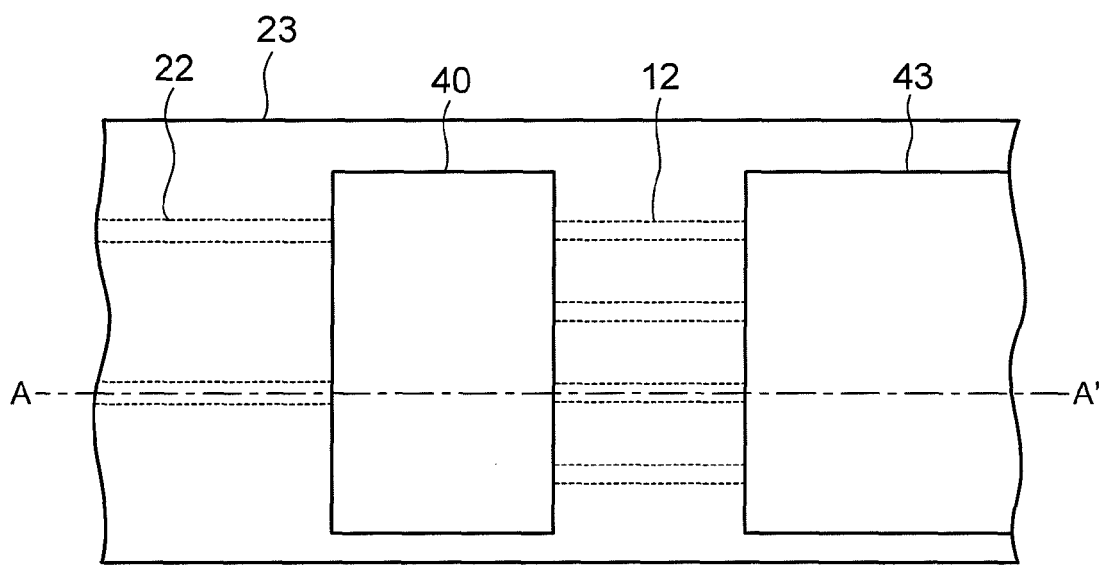
FIGS. 2A and 2B show a state (mounting structure) where an optical component and an electronic component are mounted on the surface of the package in FIGS. 1A and 1B.
Figure 2B:
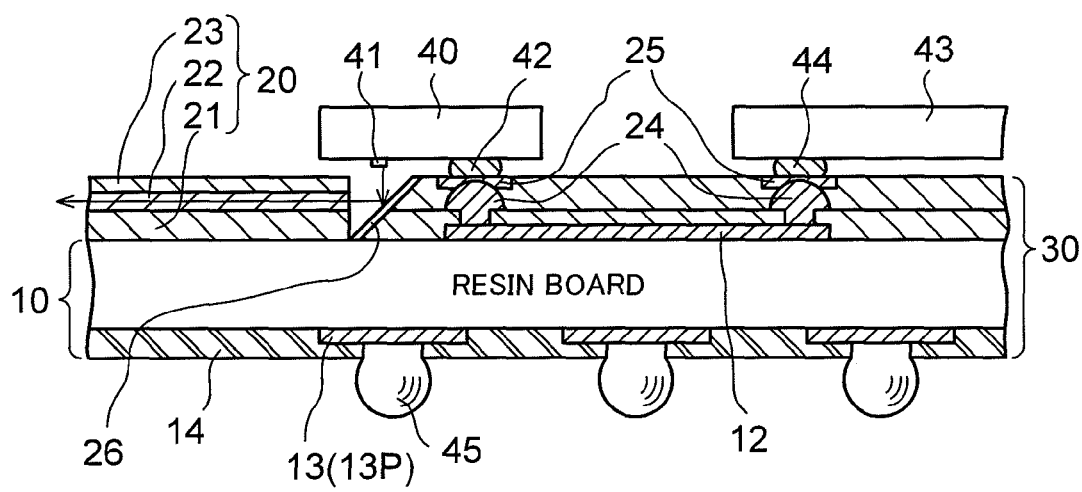
Figure 3A:
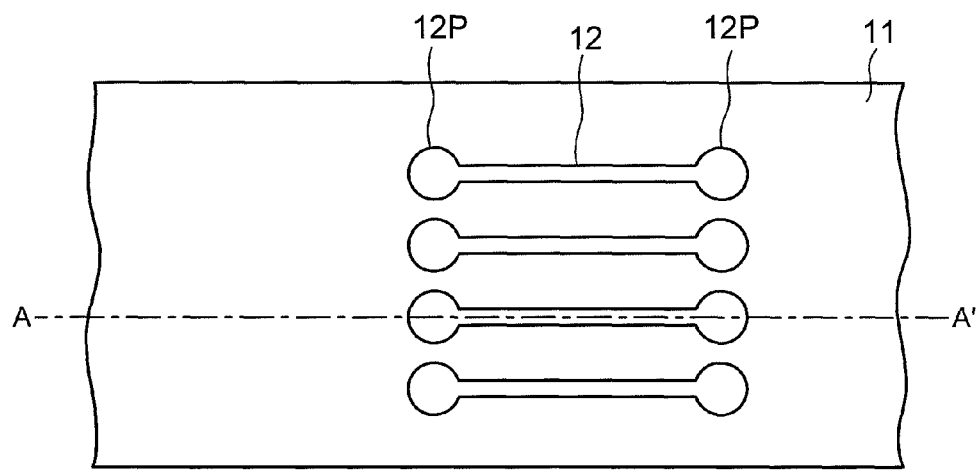
FIGS. 3A and 3B are views showing a manufacturing step for the optical waveguide laminated wiring board in FIGS. 1A and 1B.
Figure 3B:
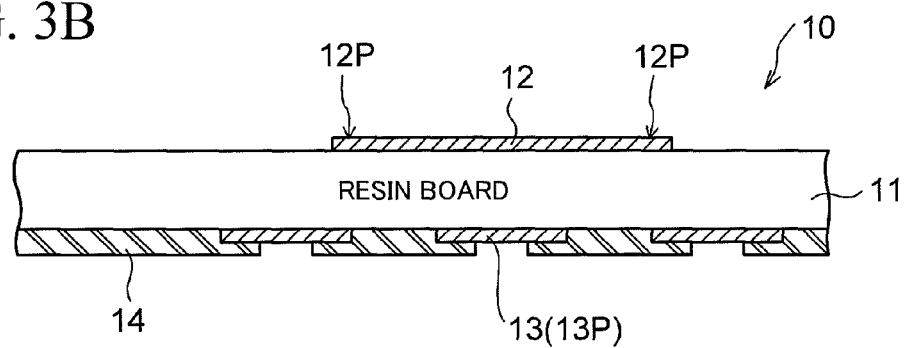

FIGS. 2A and 2B show a state (mounting structure) where an optical component 40 and an electronic component 43 are mounted on the surface of the package (optical waveguide laminated wiring board) 30 of this embodiment. FIG. 2A shows a plan view of the mounting structure seen from the top. FIG. 2B shows a longitudinal sectional structure thereof seen along the line A-A' in FIG. 2A.

Examples of the optical component 40 to be mounted include a vertical-cavity surface-emitting semiconductor laser (VCSEL), a light emitting element such as a light emitting diode (LED), and a light receiving element such as a photodiode (PD) and an avalanche photodiode (APD). Meanwhile, examples of the electronic component 43 to be mounted include an IC chip such as a driver for driving the light emitting element 40, and an IC chip incorporating an amplifier, a DSP, for processing an optical output signal from the light receiving element 40, or the like.

The optical component 40 includes: a light emitting surface 41 (in a case of the light emitting element) or a light entering surface 41 (in case of the light receiving element); and an electrode pad (unillustrated) on the surface facing the optical waveguide 20. The electrode pad is bonded to a solder bump or the like used as an electrode terminal 42 when mounted on the package 30. Through the solder bump or the like (the electrode terminal 42), the electrode pad is electrically connected to the corresponding conductor portion 25 (i.e., to the upper end surface of the conductive via) on the optical waveguide 20. Similarly, the electronic component 43 also includes an electrode pad (unillustrated) on the surface facing the optical waveguide 20. The electronic component 43 is electrically connected to the corresponding conductor portion 25 (i.e., to the upper end surface of the conductive via) on the optical waveguide 20 through a solder bump or the like (electrode terminal 44) bonded to this electrode pad. The electrode terminals 42 and 44 of the components 40 and 43 are connected to each other through the conductive vias (each having the structure in which the two conductor portions 24 and 25 are connected in a columnar shape) provided in the optical waveguide 20 and through the wiring layer 12 connected to these.

When the optical component 40 thus mounted is a light emitting element such as a VCSEL, light emitted from the light emitting surface 41 enters the opening (the V-shaped groove) of the optical waveguide 20 and is reflected at the reflection mirror 26 as indicated by the arrow in the drawing. Then, the light enters the core layer 22 of the optical waveguide 20 and transmits through the core layer 22. Likewise, when the optical component 40 thus mounted is a light receiving element such as a PD, light transmitted through the core layer 22 of the optical waveguide 20 is reflected at the reflection mirror 26. Then, the light is emitted from the opening and enters the light entering surface 41 of the optical component 40.

Moreover, a solder ball 45 used as an external connection terminal when the package is mounted on a motherboard or the like is bonded to the pad 13P exposed from the solder resist layer 14 on the side opposite to the component mounting surface side. In place of the solder ball 45, a pin may be bonded to the pad 13P. Alternatively, the pad 13P may be left exposed without being bonded to the external connection terminal.

A method of manufacturing the optical waveguide laminated wiring board (package) 30 according to this embodiment is described below with reference to FIGS. 3A to 9B showing an example thereof. Note that, a part A of each process drawing shown in FIGS. 3 to 9 shows a plan view of a processing target seen from the top in each step, and a part B thereof shows a longitudinal sectional structure thereof seen along the line A-A' in the corresponding part A.

First, in the first step (see FIGS. 3A and 3B), prepared is the wiring board 10 before integration with the optical waveguide 20. Specifically, the wiring board 10 thus prepared includes: the wiring layers 12 and 13 patterned into desired shapes on the respective surfaces of the resin board 11 constituting the wiring board body; and the solder resist layer 14 formed to cover the surface of the wiring layer 13 opposite to the component mounting surface side (the lower side in the illustrated example), but to expose the portions corresponding to the pads 13P of the wiring layer 13.

As described above, any board may constitute the resin board 11, as long as the board includes the wiring layers 12 and 13 on the outermost layers thereof, the wiring layers 12 and 13 being electrically connected to each other through the inside of the board. For example, a wiring board of a multilayer structure formed by a build-up process can be utilized. This involves sequentially repeating formation of an insulating layer (resin layer made of an epoxy resin or the like), formation of via holes in the insulating layer, and formation of a wiring pattern (typically, a wiring layer formed by copper (Cu) plating) inclusive of the insides of the via holes, on both surfaces of a core substrate (for example, a glass cloth-base epoxy resin copper-clad laminate plate) used as a base material. The outermost wiring layers 12 and 13 formed through the above process are electrically connected to each other through wiring layers formed within the board and the conductive vias through which the wiring layers are interconnected.

The wiring layers 12 and 13 are patterned into desired shapes in such a manner that the portions corresponding to the pads 12P and 13P are defined at desired positions. Specifically, the wiring layer 12 on the component mounting surface side is patterned in such a manner that the pads 12P are defined at positions corresponding to the positions of the electrode pads (the terminals 42 and 44) of the components 40 and 43 (see FIGS. 2A and 2B) to be mounted. Meanwhile, the wiring layer 13 on the side opposite to the component mounting surface side is patterned in such a manner that the pads 13P are defined at positions corresponding to the bonding positions of the external connection terminals (the solder ball 45 in FIGS. 2A and 2B) used when this package 30 is mounted on a motherboard or the like. Each of the pads 12P on the component mounting surface side is selected to have a diameter of approximately 40 μm, and a pitch (a distance between the centers of each vertically adjacent two of the pads 12P in FIG. 3A) of approximately 62.5 μm.

Moreover, the solder resist layer 14 is formed on the surface opposite to the component mounting surface side to cover the wiring layer 13 and the resin board 11 in such a manner that the solder resist layer 14 exposes the portions corresponding to the pads 13P of the wiring layer 13. For example, the wiring layer 13 and the resin board 11 are coated with a solder resist made of a photosensitive resin such as an epoxy resin or an acrylic resin. The solder resist is subjected to exposure and development (i.e., the solder resist is patterned) so as to follow desired shapes of the pads. The solder resist layer is opened at portions corresponding to regions of the pads. Thereby, the solder resist layer 14 exposes only the portions, corresponding to the pads 13P, of the wiring layer 13 and covers the other portions of the wiring layer 13.

Furthermore, nickel (Ni) plating and gold (Au) plating are performed in this order on the pads (Cu) 13P exposed from the solder resist layer 14. This is to improve the contact bonding properties between the Au layer and a solder ball or the like bonded when the package is mounted on a motherboard or the like, to enhance the adhesion between the Au layer and the Cu layer constituting the pad 13P, and to prevent Cu from diffusing into the Au layer (by the Ni layer). By the above steps, the wiring board 10 is manufactured.

On the component mounting surface side (the upper side in the illustrated example) of the wiring board 10 thus manufactured, the first cladding layer 21, the core layers 22, and the second cladding layer 23, which constitute the optical waveguide 20, are sequentially laminated according to steps of FIGS. 4A to 9B.

Figure 4A:
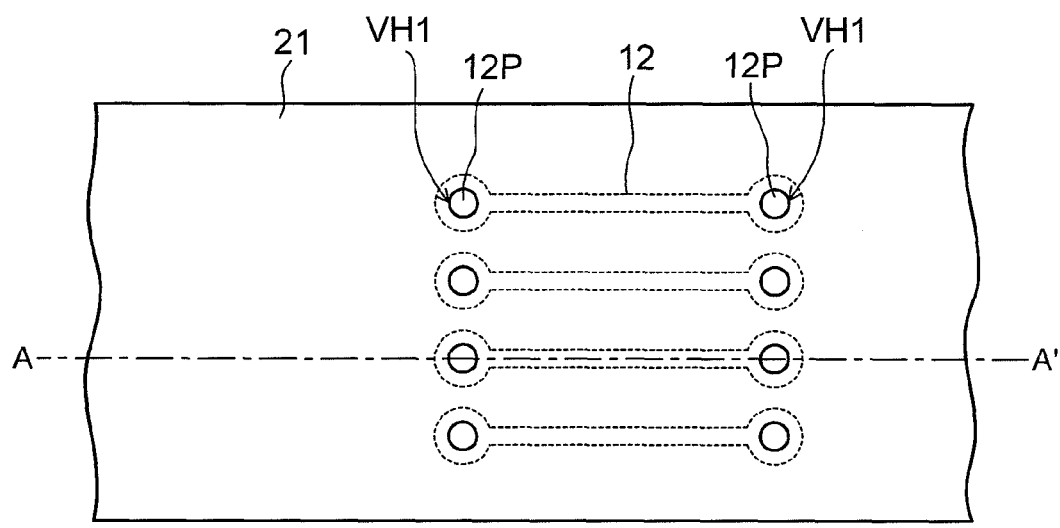
FIGS. 4A and 4B are views showing a manufacturing step following the step shown in FIGS. 3A and 3B.
Figure 4B:
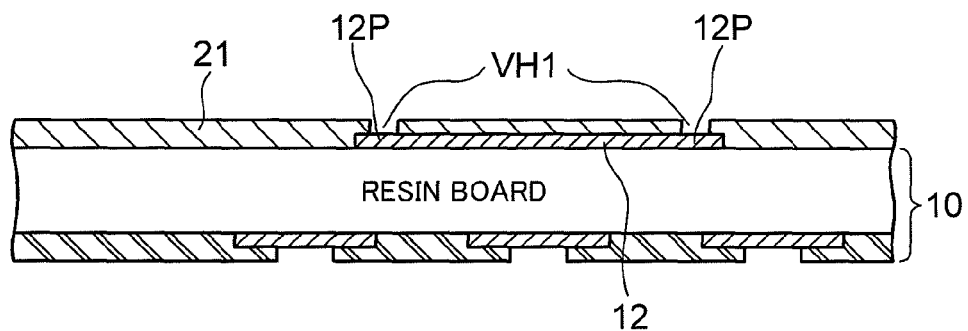

First, in the step of FIGS. 4A and 4B, the first cladding layer 21 is formed in desired thicknesses (for example, the thickness of the portion laminated on the wiring layer 12 is approximately 10 μm) on the surface of the wiring board 10 where the wiring layer 12 (including the pads 12P) is formed. Then, the via holes VH1 are formed at desired positions (corresponding to the positions of the pads 12P on the wiring board 10) of the first cladding layer 21. The via holes VH1 reach the pads 12P (opening of the vias).

As the material of the first cladding layer 21, an ultraviolet (UV) curable resin is desirably used. The used UV curable resin includes a modified acrylate (an epoxy resin, a polyester resin, or the like) as a base resin, a reactive acrylic monomer necessary for photopolymerization, a photopolymerization initiator, and an additive. The principal reaction is radical polymerization. The use of such a UV curable resin allows the treatment to be performed at normal temperature, and also has a merit of shortening the operation time because the resin is cured in a short period of time in comparison with a case where a thermosetting resin is used.

After the first cladding layer 21 is formed on the entire surface of the wiring board 10 using such a UV curable resin, the resin layer is subjected to exposure and development (i.e., the resin layer is patterned) so as to follow desired shapes of the vias (via holes VH1). Thus, the first cladding layer 21 can be opened at desired positions as illustrated. The diameter of each of the vias (via holes VH1) to be opened is selected to be approximately 15 μm.

In this step, the UV curable resin layer is patterned to form the via openings (formation of the via holes VH1). However, the via openings can be formed as desired by laser processing using an excimer laser or the like as an alternative method.

In the next step (see FIGS. 5A and 5B), a conductive material is filled in the vias (via holes VH1 in FIGS. 4A and 4B) opened in the first cladding layer 21 laminated on the wiring board 10. Thereby, the lower conductor portions 24 are formed each of which constitutes a portion of the conductive via. The top portion of the conductor portion 24 is projected from the surface of the first cladding layer 21, and is formed to have a shape spreading in a "mushroom" form or semi-spherically as illustrated. The conductive via (conductor portion 24) having such a shape can be formed by, for example, copper (Cu) electroless plating. In this case, a plating solution used for the Cu electroless plating is selected as appropriate, so that the plating solution does not allow the conductive material (Cu in this case) to adhere to the first cladding layer 21 made of the resin.

The conductor portion 24 to be formed is selected to have the projecting portion with a height of approximately 35 μm and the portion spreading in a "mushroom"-like form with a diameter of approximately 50 μm. The pitch of the pads 12P connected to the conductor portions 24 is selected to be approximately 62.5 μm (see FIG. 3A). Accordingly, an interval of approximately 12.5 μm is guaranteed between each vertically adjacent two of the conductor portions 24 in FIG. 5A.

In this step, the conductor portions 24 are formed by Cu electroless plating. However, the conductor portions 24 as desired can be formed by Cu electroplating; in this case, the wiring layers 12 can be utilized as plating seed layers (power supply layers).

In the next step (see FIGS. 6A and 6B), the core layers 22 are formed by patterning in desired thicknesses (for example, approximately 35 μm) on regions neighboring the portions where the conductor portions 24 are formed on the first cladding layer laminated on the wiring board 10. The material of the core layers 22 is basically the same UV curable resin as the material of the first cladding layer 21 described above. However, the resin material used as the core layers 22 is appropriately mixed with an additive or the like to increase the refractive index higher than that of the resin material constituting the first cladding layer 21.

In the next step (see FIGS. 7A and 7B), the second cladding layer 23 is formed in a desired thickness (for example, approximately 45 μm) on the surface of the wiring board 10 where the first cladding layer 21 and the core layers 22 are laminated. Thereby, the second cladding layer 23 covers the core layers 22 and the "mushroom"-shaped or semispherical conductor portions 24. The material of the second cladding layer 23 is the same UV curable resin as the material of the first cladding layer 21 described above.

In the next step (see FIGS. 8A and 8B), in the same manner performed in the step of FIGS. 4A and 4B, the via holes VH2 are formed at desired positions (corresponding to the positions where the conductor portions 24 are formed) of the second cladding layer 23. The via holes VH2 reach the conductor portions (opening of the vias). Specifically, the second cladding layer 23 formed in the previous step is subjected to exposure and development (i.e., the resin layer is patterned) so as to follow the desired shapes of the vias (via holes VH2). Thus, the second cladding layer 23 can be opened at desired positions as illustrated. The diameter of each of the vias (via holes VH2) to be opened is selected to be approximately 50 μm (the same as the diameter of the portion spreading in a "mushroom"-like form of the conductor portion 24).

In this step also, as in the formation of the via holes VH1 described above (FIGS. 4A and 4B), desired via openings can be formed (formation of the via holes VH2) using an excimer laser or the like instead of patterning the UV curable resin layer.

Figure 5A:
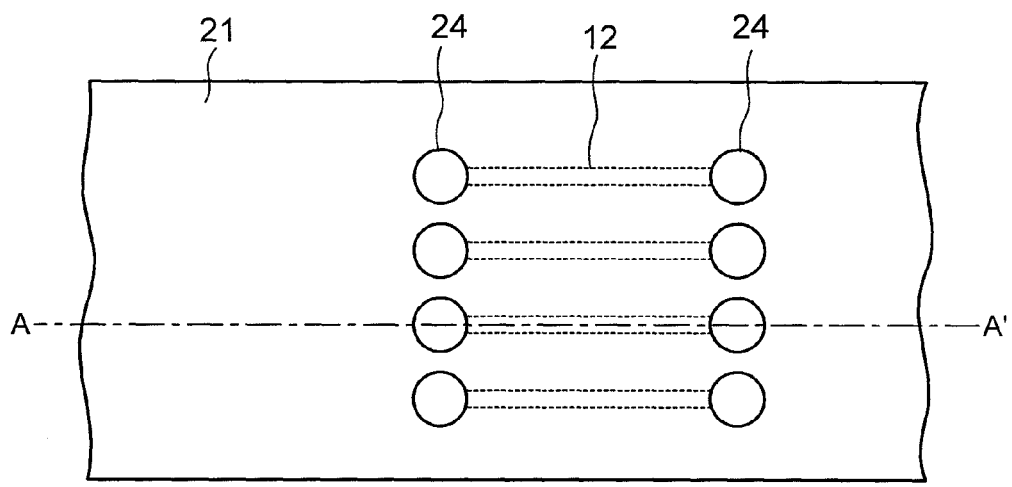
FIGS. 5A and 5B are views showing a manufacturing step following the step shown in FIGS. 4A and 4B.
Figure 5B:
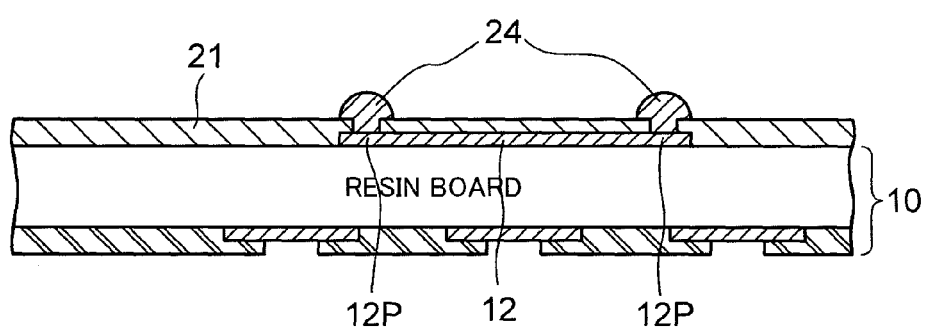
Figure 6A:
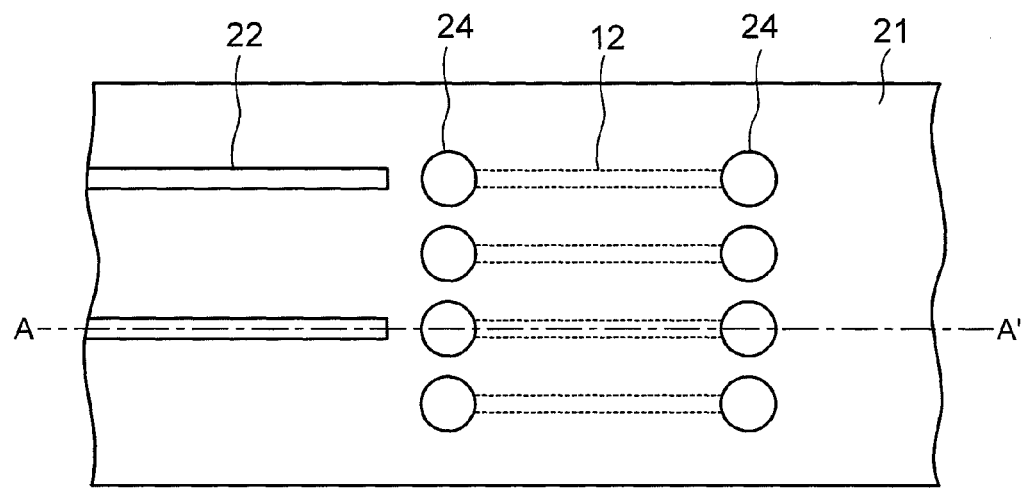
FIGS. 6A and 6B are views showing a manufacturing step following the step shown in FIGS. 5A and 5B.
Figure 6B:
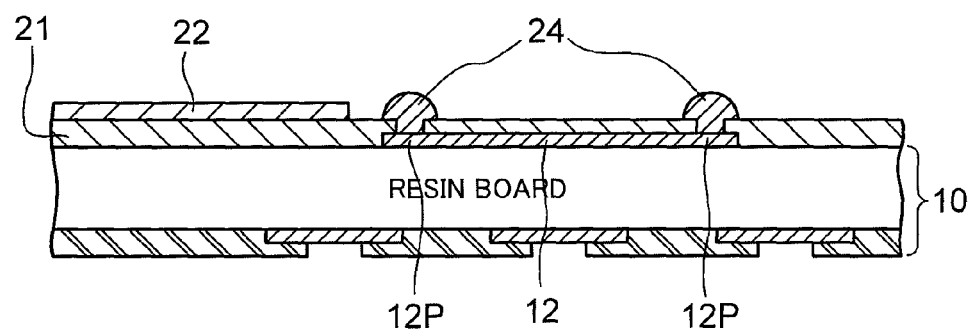
Figure 7A:
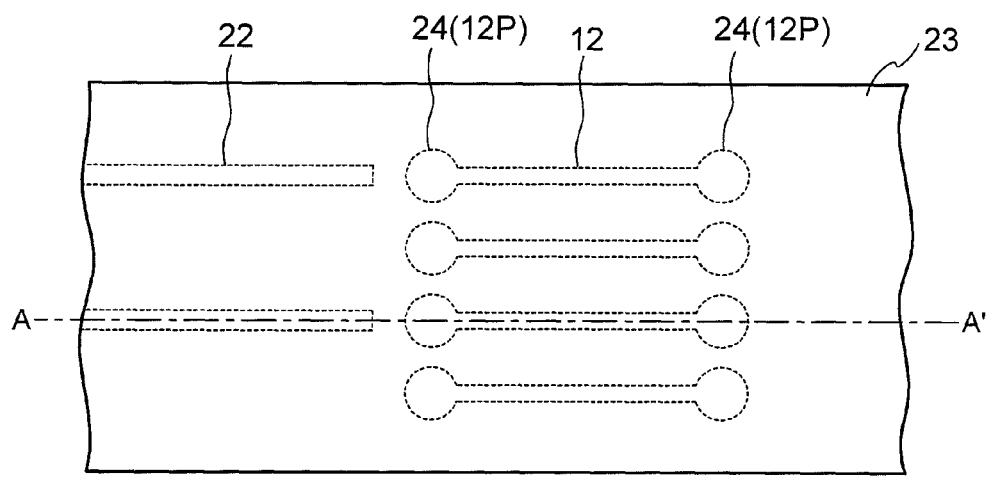
FIGS. 7A and 7B are views showing a manufacturing step following the step shown in FIGS. 6A and 6B.
Figure 7B:
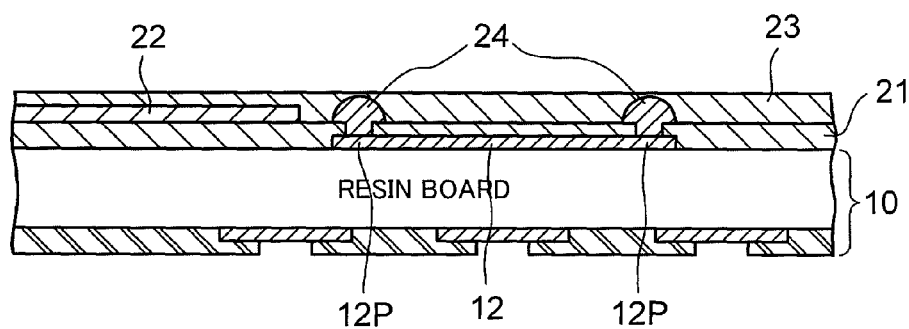

In the final step (see FIGS. 9A and 9B), in the same manner performed in the step of FIGS. 5A and 5B, a conductive material is filled in the vias (via holes VH2 in FIGS. 8A and 8B) opened in the second cladding layer 23 laminated on the first cladding layer 21 and the core layers 22 on the wiring board 10. Thereby, the upper conductor portions 25 are formed each of which constitutes the remaining portion of the conductive via. The conductor portions 25 are formed to be exposed on the same plane as the surface of the second cladding layer 23 as illustrated. As the formation method thereof, copper (Cu) electroless plating is adopted as in the formation of the conductor portions 24 described above. A plating solution used does not allow the conductive material (Cu in this case) to adhere to the second cladding layer (resin layer) 23. By the filling of the vias by this Cu electroless plating, the upper conductor portions 25 are connected to the lower conductor portions 24 having a "mushroom" or semispherical shape.

In this step also, the conductor portions 25 as desired can be formed by Cu electroplating utilizing the wiring layers 12 as plating seed layers instead of the Cu electroless plating.

Figure 9A:
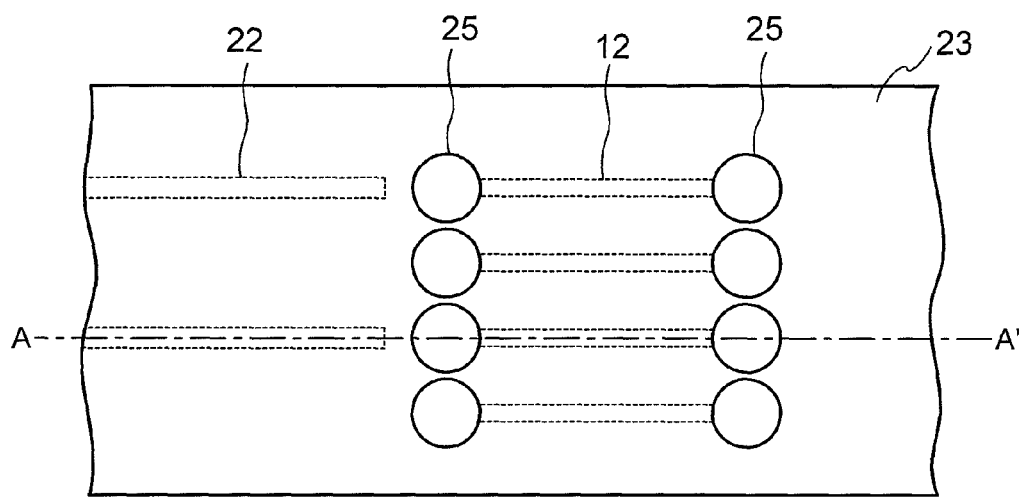
FIGS. 9A and 9B are views showing a manufacturing step following the step shown in FIGS. 8A and 8B.
Figure 9B:
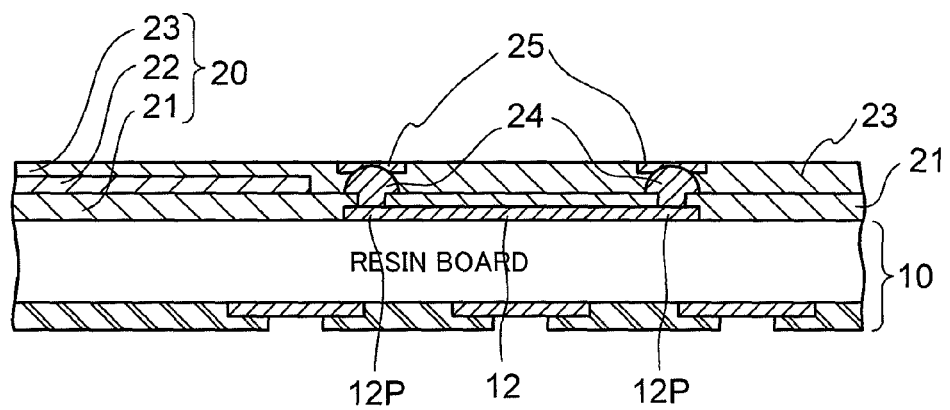

Furthermore, although not shown in FIGS. 9A and 9B, the reflection mirror 26 is formed at a desired position in the optical waveguide 20 (i.e., the position facing the light emitting surface/light entering surface 41 when the optical component 40 is mounted on the this package 30 as exemplified in FIGS. 2A and 2B). The method of forming the reflection mirror 26 is not particularly limited, and a formation method known to those skilled in the art can be adopted. For example, a V-shaped groove is formed at a desired position in the optical waveguide 20 by mechanical processing with a diamond saw or blade having a V-shaped tip end, a laser ablation method, or the like. Then, a film of a glossy metal such as gold (Au) or silver (Ag) is deposited (selectively using a mask or the like) on the inclined surface of this groove by sputtering, vapor deposition, or the like (formation of the reflection mirror 26).

Furthermore, as needed, solder may be deposited, for example, by pre-soldering on the exposed surfaces of the upper conductor portions 25 of the conductive vias in consideration of convenience for a customer and so forth. This is to facilitate the connection between the exposed surface and an electrode terminal (solder bump, or the like) of a component to be mounted.

By the above steps, the package (optical waveguide laminated wiring board) 30 of this embodiment is manufactured.

As has been described, in the method of manufacturing the optical waveguide laminated wiring board (package) 30 according to this embodiment (FIGS. 3A to 9B), the conductive vias (each having a structure in which the two conductor portions 24 and 25 are connected to each other in a columnar shape) are formed at desired positions of the optical waveguide 20 integrally laminated on the wiring board 10. In this method, the formation of the conductive via is divided in two stages.

Specifically, the first cladding layer 21 is laminated on the wiring board 10. A via opening is formed in the first cladding layer 21 (formation of the via hole VH1). A conductive material (Cu) is filled in the via opening by Cu electroless plating, or the like, to thereby form the conductor portion (a portion of the conductive via) projecting in a "mushroom"-like form or semispherically. After that, the second cladding layer 23 is formed to cover the conductor portion 24, the core layers 22, and the first cladding layer 21. A via opening is formed in the second cladding layer 23 (formation of the via hole VH2). A conductive material (Cu) is filled in the via opening by Cu electroless plating, or the like, to thereby form the conductor portion 25 (the remaining portion of the conductive via) connected to the conductor portion 24.

In a conventional method as mentioned above, after an optical waveguide (including a core layer and cladding layers laminated on and below the core layer in a sandwiching manner) is completed, the opening and the filling of a via are performed. Accordingly, a restriction is imposed by the aspect ratio and the via depth, which makes the fine pitch arrangement of conductive vias difficult.

In contrast, in the method of this embodiment, while the optical waveguide 20 is formed by laminating the first cladding layer 21, the core layers 22, and the second cladding layer 23, the opening and the filling of vias are performed. Accordingly, no restriction is imposed by the aspect ratio and the via depth, and thus the fine pitch arrangement of conductive vias is feasible.

Moreover, since the formation of the conductive via is divided in two stages, the aspect ratio of each of the vias (the conductor portions 24 and 25) formed in the respective stages can be selected to be higher than 1. This enables eliminating such a problem of an electrical continuity failure as encountered in the prior art due to insufficient filling of a via opening with a conductive material. Consequently, the reduction in yield rate is prevented.

Additionally, accuracy of patterning the second cladding layer 23 can be relaxed to some extent. Namely, in a method as in the prior art in which the opening and the filling of a via are performed after the optical waveguide is completed, a restriction is imposed by the aspect ratio and the via depth. The restriction, in turn, limits the method in that, when via openings are formed by patterning every time a cladding layer is laminated, high accuracy of positioning vias (patterning accuracy) is desired. Incidentally, in the conventional method, when a via is formed in an optical waveguide having the same thickness as that of the optical waveguide 20 in this embodiment, the via needs to be formed within an error range of 2 to 3 μm or lower.

In contrast, in the method of this embodiment, when a conductive material is filled in a via (via hole VH1) opened in the first cladding layer 21 (FIGS. 5A and 5B), formed is the conductor portion 24 having the top portion spreading in a "mushroom"-like form or semispherically. Accordingly, when a via (via hole VH2) reaching this conductor portion 24 is formed in the second cladding layer 23 (FIGS. 8A and 8B), the via is formed at a shallow depth in the second cladding layer 23. This allows the error range of the formation position of the via up to approximately 5 to 10 μm (relaxation for accuracy of patterning the second cladding layer).

What is claimed is:

1. A method of manufacturing an optical waveguide laminated wiring board, the method comprising:
   preparing a wiring board including a pad for connection;
   forming a first cladding layer on a surface of the wiring board on a side where the pad is formed, and then forming a first via hole in the first cladding layer, the first via hole reaching the pad;
   filling conductive material in the first via hole so as to form a first conductor portion having a top portion projecting from a surface of the first cladding layer and spreading semispherically thereon;
   forming a core layer on the first cladding layer in a region neighboring a portion where the first conductor portion is formed on the first cladding layer;
   forming a second cladding layer on the first cladding layer and the core layer so as to cover the first conductor portion with the second cladding layer, and then forming a second via hole in the second cladding layer, the second via hole reaching the first conductor portion; and
   filling conductive material in the second via hole so as to form a second conductor portion electrically connected to the first conductor portion.

2. The method according to claim 1, wherein an ultraviolet curable resin is used as a material for each of the first cladding layer and the second cladding layer, and the cladding layers each formed using the resin are patterned by exposure and development to form the first and the second via holes, respectively.

3. The method according to claim 1, wherein the first and second via holes are formed in the cladding layers by performing laser processing thereon.

4. The method according to claim 1, wherein each of the first conductor portion and the second conductor portion is formed by any of electroless plating and electroplating.

5. The method according to claim 1, further comprising, after forming the second conductor portion, forming a reflection mirror at a position in an optical waveguide including the first cladding layer, the core layer and the second cladding layer, the position facing any of a light emitting surface and a light entering surface of an optical component to be mounted.

6. The method according to claim 1, wherein the first conductor portion projects with a mushroom-like shape.

7. The method according to claim 1, wherein the core layer is formed in a linear shape and an end portion of the linear core layer is positioned in the vicinity of the first conductor portion.

8. The method according to claim 1, wherein the second conductor portion is formed to be exposed on a same plane as a surface of the second cladding layer.

9. The method according to claim 8, wherein the surface of the second cladding layer lies in the same plane as a surface of the second conductor portion.

* * * * *